(12) United States Patent
Hsieh et al.

(10) Patent No.: US 11,601,050 B2
(45) Date of Patent: Mar. 7, 2023

(54) VOLTAGE REGULATION SYSTEM WITH VARIABLE CLOCK FREQUENCY AND METHOD THEREOF

(71) Applicant: NUVOTON TECHNOLOGY CORPORATION, Hsinchu (TW)

(72) Inventors: Chung-Ming Hsieh, Zhubei (TW); Wei-Chan Hsu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 138 days.

(21) Appl. No.: 17/023,762

(22) Filed: Sep. 17, 2020

(65) Prior Publication Data

US 2021/0313879 A1 Oct. 7, 2021

(30) Foreign Application Priority Data

Apr. 7, 2020 (TW) .................. 109111636

(51) Int. Cl.
*H02M 3/155* (2006.01)
*H03K 5/24* (2006.01)
*H02M 1/00* (2006.01)

(52) U.S. Cl.
CPC ......... *H02M 3/155* (2013.01); *H02M 1/0035* (2021.05); *H03K 5/24* (2013.01); *H02M 1/0054* (2021.05)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582;
(Continued)

(56) References Cited

U.S. PATENT DOCUMENTS 7,560,914 B2 * 7/2009 O'Driscoll ........ H02M 3/33561
                                                    323/267
7,764,054 B1 * 7/2010 Guo ....................... H02M 3/156
                                                    323/283
(Continued)

*Primary Examiner* — Thienvu V Tran
*Assistant Examiner* — Nusrat Quddus
(74) *Attorney, Agent, or Firm* — Snyder, Clark, Lesch & Chung, LLP

(57) ABSTRACT

A voltage regulation system is provided. In the voltage regulation system, a frequency of a clock signal is adjusted and a pulse generator is controlled to output a pulse signal to a switch power stage circuit, to enable the switch power stage circuit to adjust an output voltage and output the adjusted output voltage to the load element. Through the aforementioned configuration, the switch power stage circuit adjusts the output voltage according to the situation of the load element, thus decreasing the power loss of the switch power stage circuit.

12 Claims, 7 Drawing Sheets

(58) Field of Classification Search
CPC ......... H02M 2003/1557; H05B 39/048; B23K 11/24; H04B 2215/069
See application file for complete search history.

(56) References Cited

U.S. PATENT DOCUMENTS

| | | | | |
|---|---|---|---|---|
| 8,884,676 | B2* | 11/2014 | Wong | H03K 3/017 |
| | | | | 327/31 |
| 9,568,889 | B1* | 2/2017 | Lee | G04F 10/04 |
| 10,116,207 | B1* | 10/2018 | Malinin | H02M 3/157 |
| 10,186,948 | B2* | 1/2019 | Moon | H02M 1/32 |
| 2006/0043943 | A1* | 3/2006 | Huang | H02M 3/158 |
| | | | | 323/222 |
| 2010/0033261 | A1* | 2/2010 | Stevenson | H03K 7/08 |
| | | | | 332/109 |
| 2015/0137778 | A1* | 5/2015 | Miyazaki | H02M 3/156 |
| | | | | 323/271 |
| 2015/0194891 | A1* | 7/2015 | Kim | H02M 1/44 |
| | | | | 323/271 |
| 2019/0004577 | A1* | 1/2019 | Laur | G06F 1/26 |

* cited by examiner

VOLTAGE REGULATION SYSTEM WITH VARIABLE CLOCK FREQUENCY AND METHOD THEREOF

CROSS-REFERENCE TO RELATED APPLICATION

This application claims priority from Taiwan Patent Application No. 109111636, filed on Apr. 7, 2020, in the Taiwan Intellectual Property Office, the content of which is hereby incorporated by reference in its entirety for all purposes.

BACKGROUND

1. Technical Field

The present disclosure relates to a voltage regulation system and method thereof which adjusts the frequency of the clock signal and controls the output of the pulse signal.

2. Description of the Related Art

In the era of the prevalence of electronic technology, each electronic device has specific voltage requirements. Therefore, a voltage regulator is needed to adjust voltages to accord with the specification thereof. Voltage regulators commonly used on the market are switch voltage regulators. The switch voltage regulators are unlikely to generate heat, and voltage may be steadily outputted to a load element by switching a switch element therein to adjust the voltage. However, the existing switch voltage regulators cannot adjust a switching frequency of the switch element according to the situation of the load element, resulting in the switch element still in a conducting state when the load element is under low loading, thus increasing the power loss of the switch power stage circuit.

In summary, the inventor of the present disclosure has designed a voltage regulation system and method thereof, which improves the defects presented in the prior art and will further improve the practical implementation in industries.

SUMMARY

According to the problems mentioned above, the subject of the present disclosure is to provide a voltage regulation system to solve the problems that may be encountered in the prior art.

Based on the above, the present disclosure provides a voltage regulation system, including a switch power stage circuit, a pulse generator, a comparator, and a clock generator. The switch power stage circuit has an output end electrically connected to a load element, wherein a voltage on the output end of the switch power stage circuit is defined as an output voltage. The pulse generator is connected to the switch power stage circuit and configured to output a pulse signal to the switch power stage circuit to trigger the switch power stage circuit to supply power to the load element. The comparator has a first input end, a second input end, an output end, and a trigger end. The first input end receives the output voltage, the second input end receives a reference voltage, and the output end is connected to the pulse generator. When the comparator is triggered through the trigger end, the comparator performs a comparison on the output voltage and the reference voltage; and when the comparator determines that the output voltage is lower than the reference voltage, the comparator outputs a control signal to trigger the pulse generator to output the pulse signal. The clock generator is configured to generate a clock signal, wherein the comparator triggers the comparison based on the clock signal and the pulse signal. A frequency of the clock signal is dynamically adjusted based on the pulse signal and the control signal.

In an embodiment of the present disclosure, the comparator triggers the comparison respectively on a positive edge of the clock signal and a negative edge of the pulse signal, and in a condition that the comparator outputs the control signal when the positive edge of the clock signal appears and the comparator does not output the control signal when the negative edge of the pulse signal appears, the frequency of the clock signal stays the same.

In an embodiment of the present disclosure, in a condition that the comparator outputs the control signal when the positive edge of the clock signal appears and the comparator also outputs the control signal when the negative edge of the pulse signal, the frequency of the clock signal is increased.

In an embodiment of the present disclosure, in a condition that the comparator does not output the control signal when the positive edge of the clock signal appears the frequency of the clock signal is decreased.

In an embodiment of the present disclosure, the voltage regulation system of the present disclosure further includes a negative edge detector for detecting the negative edge of the pulse signal.

In an embodiment of the present disclosure, the voltage regulation system of the present disclosure further includes an OR gate, wherein the OR gate is connected to the negative edge detector, the clock generator, and the trigger end of the comparator, wherein the OR gate generates the trigger signal to the trigger end of the comparator based on a detection result of the negative edge detector and the positive edge of the clock signal.

In an embodiment of the present disclosure, the comparator is a latch-type comparator.

Based on the above, the present disclosure provides a voltage regulation method, including (1) outputting a pulse signal to trigger a switch power stage circuit to supply power to a load element, wherein a voltage on the output end of the switch power stage circuit is defined as an output voltage; (2) performing a comparison on the output voltage and a reference voltage by using a comparator, wherein when the comparator determines that the output voltage is lower than the reference voltage, the comparator outputs a control signal to trigger the pulse generator to output the pulse signal; (3) inputting a clock signal to the comparator to trigger the comparator to perform the comparison based on the clock signal and the pulse signal; and (4) dynamically adjusting a frequency of the clock signal based on the pulse signal and the control signal.

In an embodiment of the present disclosure, the comparator triggers the comparison respectively on a positive edge of the clock signal and a negative edge of the pulse signal, and in a condition that the comparator outputs the control signal when the positive edge of the clock signal appears and the comparator does not output the control signal when the negative edge of the pulse signal appears, the frequency of the clock signal stays the same.

In an embodiment of the present disclosure, in a condition that the comparator outputs the control signal when the positive edge of the clock signal appears and the comparator also outputs the control signal when the negative edge of the pulse signal, the frequency of the clock signal is increased.

In an embodiment of the present disclosure, in a condition that the comparator does not output the control signal when the positive edge of the clock signal appears, the frequency of the clock signal is decreased.

In an embodiment of the present disclosure, the voltage regulation method of the present disclosure further includes detecting the negative edge of the pulse signal by a negative edge detector.

In an embodiment of the present disclosure, the voltage regulation method of the present disclosure further includes connecting an OR gate to the negative edge detector, the clock generator, and the trigger end of the comparator, wherein the OR gate generates a trigger signal to the trigger end of the comparator by the OR gate based on a detection result of the negative edge detector and the positive edge of the clock signal.

Based on the above, the present disclosure further provides a voltage regulation system, including: a switch power stage circuit, a pulse generator, a clock generator, a comparator. The switch power stage circuit has an output end electrically connected to a load element, wherein a voltage on the output end of the switch power stage circuit is defined as an output voltage. The pulse generator is connected to the switch power stage circuit and configured to output a pulse signal to the switch power stage circuit to trigger the switch power stage circuit to supply power to the load element. The clock generator is configured to generate a clock signal. The comparator is configured to perform a first comparison on the output voltage and the reference voltage based on a clock signal, and when the comparator determines that the output voltage is lower than the reference voltage, the comparator outputs a control signal to trigger the pulse generator to output the pulse signal, and wherein the comparator performs a second comparison on the output voltage and the reference voltage in response to a fall edge of the pulse signal. A frequency of the clock signal is to increase or stay the same based on a result of the second comparison.

Accordingly, the voltage regulation system of the present disclosure adjusts the frequency of the clock signal and controls the pulse generator to output a pulse signal to the switch power stage circuit, to enable the switch power stage circuit to adjust an output voltage and output the adjusted output voltage to the load element according to the situation of the load element, thus decreasing the power loss of the switch power stage circuit.

DESCRIPTION OF THE PREFERRED EMBODIMENTS

The advantages, features, and technical methods of the present disclosure are to be explained in detail with reference to the exemplary embodiments and the drawings for a better understanding of the present disclosure. Moreover, the present disclosure may be realized in different forms, and should not be construed as being limited to the embodiments set forth herein. Conversely, for a person of ordinary skill in the art, the embodiments provided shall make the present disclosure convey the scope more thoroughly, comprehensively, and completely. In addition, the present disclosure shall be defined only by the appended claims.

It should be noted that although the terms "first," "second," and the like may be used in the present disclosure to describe various elements, components, regions, layers and/or parts, these elements, components, regions, layers and/or parts should not be limited by these terms. These terms are only used to distinguish one element, component, region, layer, and/or part from another element, component, region, layer, and/or part. Hence, the "first element", "first component", "first region", "first layer" and/or "first part" discussed hereinafter may be referred to as "second component", "second region", "second layer" and/or "second part" without departing from the teachings of the present disclosure.

In addition, the terms "include" and/or "contain" are used to indicate the presence of features, regions, entirety, steps, operations, elements and/or components, but may not exclude the presence or addition of one or more of other features, regions, entirety, steps, operations, elements, components, and/or combinations thereof.

Unless otherwise defined, all terms (including technical and scientific terms) used in the present disclosure have the same meaning as those commonly understood by a person of ordinary skill in the art. It should be further understood that, unless explicitly defined herein, the terms such as those defined in commonly used dictionaries should be interpreted as having definitions consistent with their meaning in the context of the related art and the present disclosure, and should not be construed as idealized or overly formal.

Figure 1:
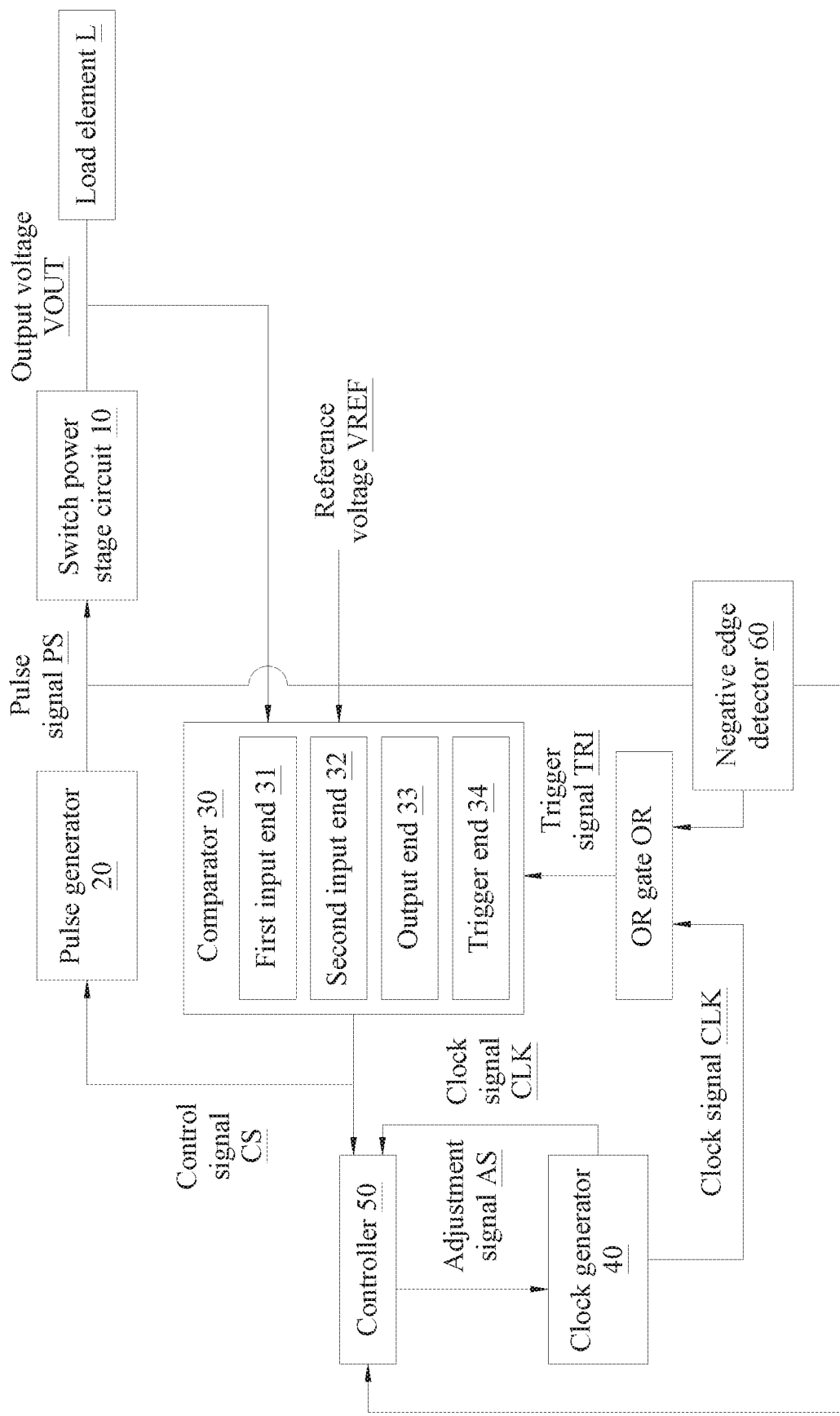
FIG. 1 is a block diagram of the first embodiment of the voltage regulation system according to the present disclosure.
Figure 2:
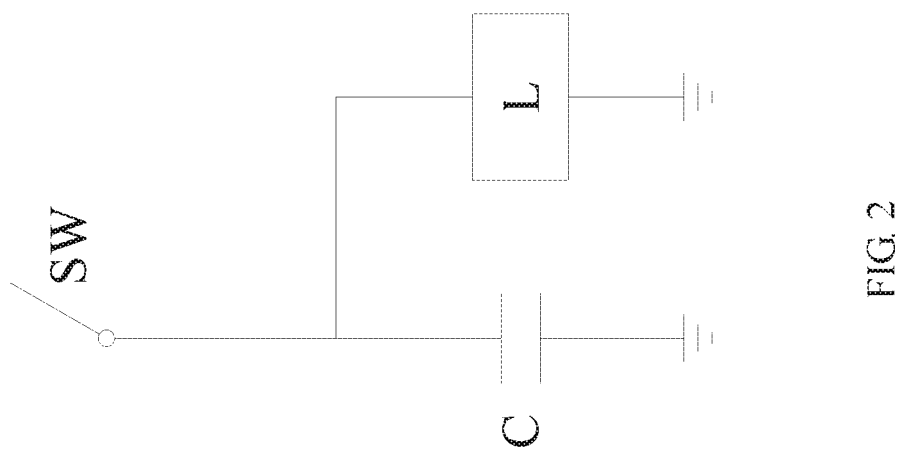
FIG. 2 is a circuit diagram of the switch power stage circuit of the first embodiment of the voltage regulation system according to the present disclosure.

Please refer to FIG. 1 to FIG. 3B which are a block diagram of the first embodiment of the voltage regulation system according to the present disclosure, a circuit diagram of the switch power stage circuit of the first embodiment of the voltage regulation system according to the present disclosure, and signal waveform diagrams of the first embodiment of the voltage regulation system according to the present disclosure. As shown in FIG. 1 and FIG. 2, the voltage regulation system of the present disclosure includes a switch power stage circuit 10, a pulse generator 20, a comparator 30, a clock generator 40, and a controller 50. An output end of the switch power stage circuit 10 is electrically connected to a load element L to supply power to the load element L, wherein a voltage on the output end of the switch power stage circuit 10 is defined as an output voltage. The pulse generator 20 is connected to the switch power stage circuit 10 and configured to output a pulse signal PS to the switch power stage circuit 10 to trigger the switch power stage circuit 10 to supply power to the load element L.

The comparator 30 has a first input end 31, a second input end 32, an output end 33, and a trigger end 34. The first input end 31 is connected to the switch power stage circuit 10 to receive the output voltage VOUT, the second input end 32 receives a reference voltage VREF, and the output end 33 is connected to the pulse generator 20. When the comparator 30 is triggered through the trigger end 34, the comparator 30 performs a comparison on the output voltage VOUT and the reference voltage VREF, and when the comparator 30 determines that the output voltage VOUT is lower than the reference voltage VREF, the comparator 30 outputs a control signal CS to trigger the pulse generator 20 to output the pulse signal PS. The clock generator 40 is configured to generate a clock signal CLK, wherein the comparator 30 triggers the comparison based on the clock signal CLK and the pulse signal PS. The controller 50 is connected to the comparator 30 and the clock generator 40. A frequency of the clock signal CLK is dynamically adjusted based on the pulse signal PS and the control signal CS. The operation of the comparator 30 and the controller 50 is described in detail in the following paragraph.

In one embodiment, as shown in FIG. 2, the switch power stage circuit 10 may be formed of a transistor T, a switch SW, and a capacitance C, and the pulse generator 20 is configured to output a pulse signal PS to the switch SW for turning on or off the switch SW. The switch power stage circuit 10 may also be other types of power stage circuits without being limited in the scope exemplified by the present disclosure. The comparator 30 is a latch-type comparator, and the comparator 30 may also be other types of comparators without being limited in the scope exemplified by the present disclosure.

In another embodiment, the voltage regulation system of the present disclosure further includes a negative edge detector 60 and an OR gate OR. The negative edge detector 60 is connected to the pulse generator 20, the controller 50, and the OR gate OR, the two input ends of the OR gate OR are respectively connected to the clock generator 40 and the negative edge detector 60, and the output end of the OR gate OR is connected to the trigger end 34 of the comparator 30. The negative edge detector 60 detects whether the negative edge of the pulse signal PS appears; when the negative edge of the pulse signal PS appears or the positive edge of the clock signal CLK appears, the OR gate OR generates a trigger signal TRI to the trigger end 34 of the comparator 30 to trigger the comparator 30 to perform a comparison.

Figure 3A:
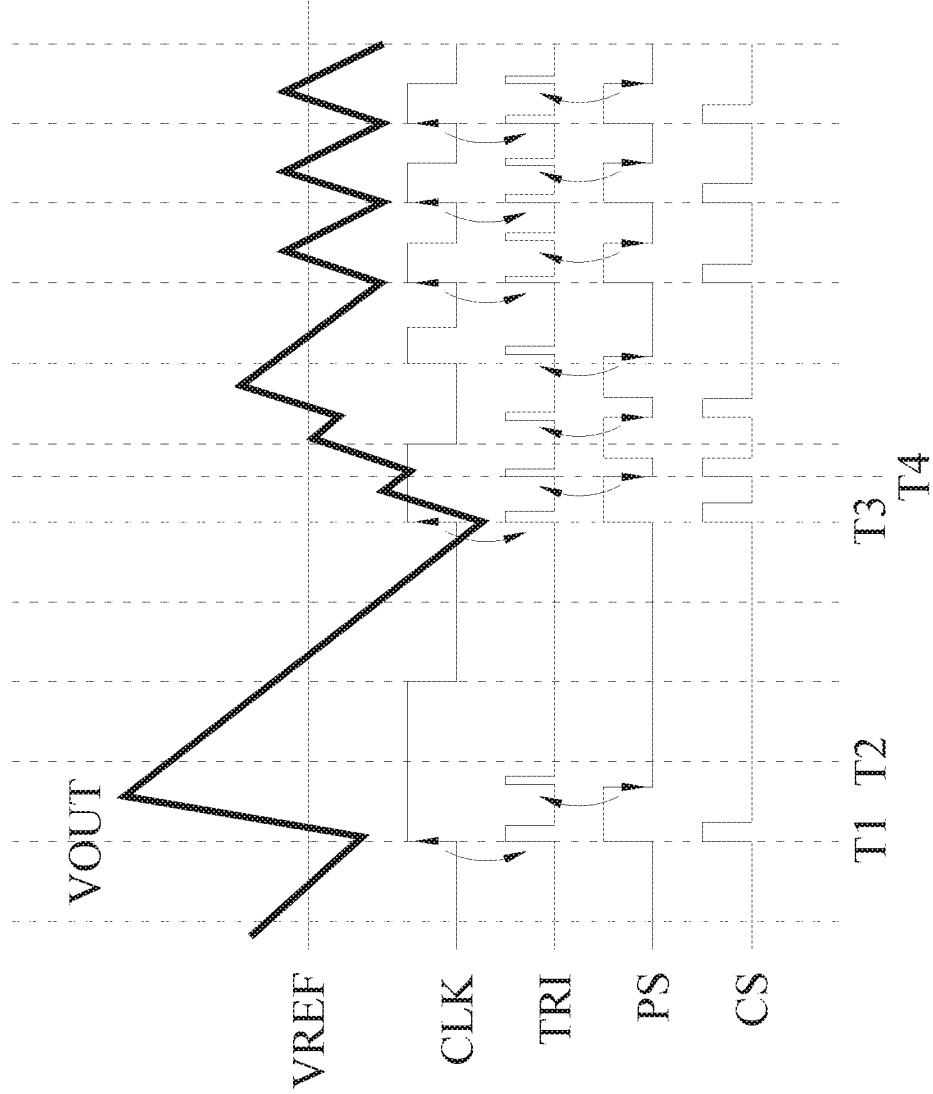
FIGS. 3A and 3B are signal waveform diagrams of the first embodiment of the voltage regulation system according to the present disclosure.
Figure 3B:
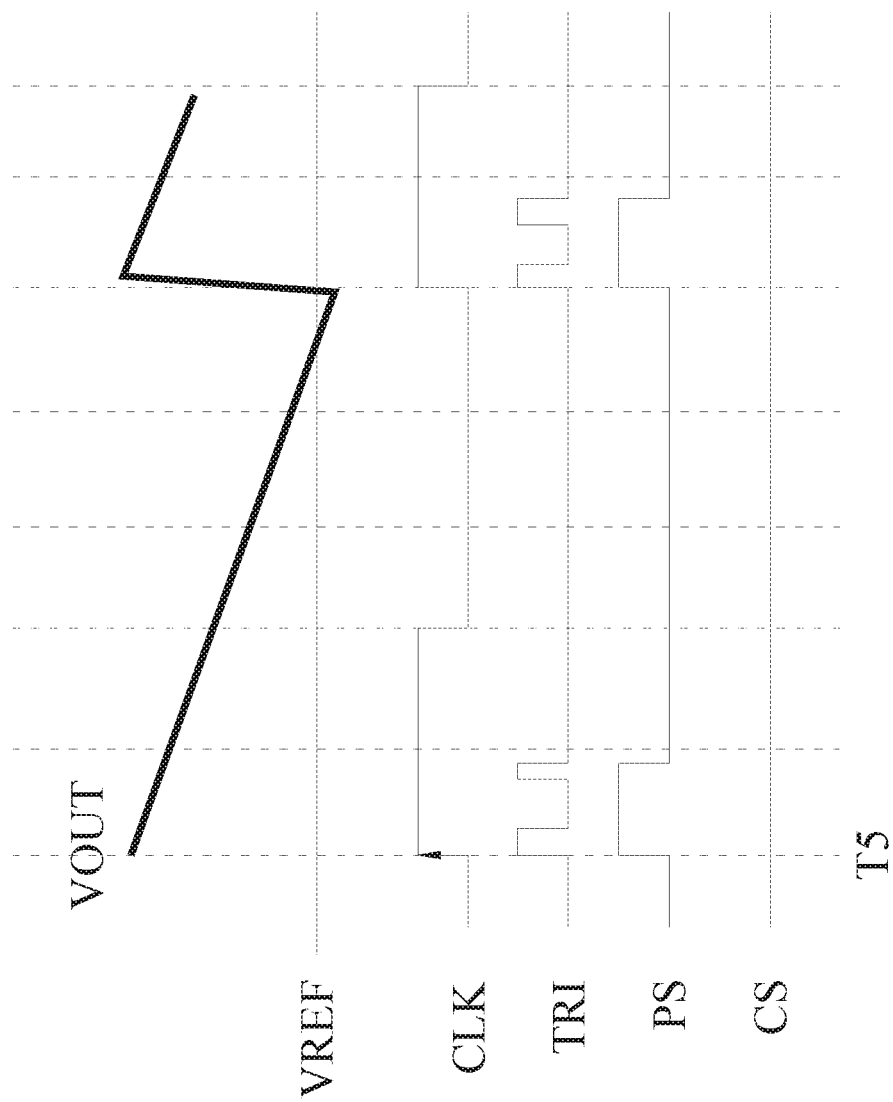

Herein, the operation of the voltage regulation system of the present disclosure is described with reference to FIG. 1, FIG. 3A, and FIG. 3B as follows. In the first situation, as shown in 3A, in a condition that the comparator 30 outputs the control signal CS when the positive edge of the clock signal CLK appears (as shown in the time point T1) and the comparator 30 does not output the control signal CS when the negative edge of the pulse signal PS appears (as shown in the time point T2), the controller 50 may determine the time point of the negative edge of the pulse signal PS after powering via the switch power stage circuit 10 (The output voltage VOUT is smaller than the reference voltage VREF), which indicates that the frequency of the clock signal CLK does not require adjustment. Thus, the controller 50 outputs an adjustment signal AS which represents no adjustment to the frequency, and the frequency of the clock signal CLK stays the same based on the adjustment signal AS. In this situation, the OR gate OR does not adjust the frequency of the trigger signal TRI based on the frequency of the unadjusted clock signal CLK and the negative edge of the pulse signal PS. The comparator 30 still maintains the original frequency of the trigger signal TRI to send the control signal CS to the pulse generator 20, and the pulse generator 20 still maintains the original frequency to send the pulse signal PS to the switch SW of the switch power stage circuit 10.

In the second situation, as shown in 3A, in a condition that the comparator 30 outputs the control signal CS when the positive edge of the clock signal CLK appears (as shown in the time point T3) and the comparator 30 also outputs the control signal CS when the negative edge of the pulse signal PS appears (as shown in the time point T4), the controller 50 may determine the time point of the negative edge of the pulse signal PS after powering via the switch power stage circuit 10 (The output voltage VOUT is smaller than the reference voltage VREF), which indicates that the frequency of the clock signal CLK needs to be increased. Thus, the controller 50 outputs an adjustment signal AS which represents the increased frequency of the clock signal CLK, and the frequency of the clock signal CLK is increased based on the adjustment signal AS. In this situation, the OR gate OR increases the frequency of the trigger signal TRI based on the increased frequency of the clock signal CLK and the negative edge of the pulse signal PS. The comparator 30 is, therefore, often triggered to increase the frequency of the control signal CS. The frequency of the pulse signal PS sent by the pulse generator 20 increases and the switching rate of the switch SW of the switch power stage circuit 10 is accelerated accordingly.

In the third situation, as shown in 3B, in a condition that the comparator 30 does not output the control signal CS when the positive edge of the clock signal CLK appears (as shown in the time point T5), the controller 50 may determine the time point of the negative edge of the pulse signal PS after powering via the switch power stage circuit 10, which indicates that the frequency of the clock signal CLK needs to be decreased. Thus, the controller 50 outputs an adjustment signal AS which represents the decreased frequency of the clock signal CLK, and the frequency of the clock signal CLK is decreased based on the adjustment signal AS. In this situation, the OR gate OR decreases the frequency of the trigger signal TRI based on the decreased frequency of the clock signal CLK and the negative edge of the pulse signal PS. The comparator 30 is, therefore, less triggered to decrease the frequency of the control signal CS. The frequency of the pulse signal PS sent by the pulse generator 20 decreases and the switching rate of the switch SW of the switch power stage circuit 10 is decelerated accordingly.

Wherein, the frequency of the clock signal CLK increased by the clock generator 40 may be, for example, twice the original frequency of the clock signal CLK, and the frequency of the clock signal CLK increased by the clock generator 40 may be, for example, half the original frequency of the clock signal CLK. The increased and decreased multiples as mentioned above are only examples and may also be other multiples without being limited in the scope exemplified by the present disclosure.

It should be noted that the controller 50 is an example for the manner of dynamically adjusting frequency of the clock signal based on the pulse signal and the control signal, but the present invention is not limited thereto; In an embodiment, the manner of dynamically adjusting frequency of the clock signal can be implemented by combinational logic circuit or other control circuit.

Figure 4:
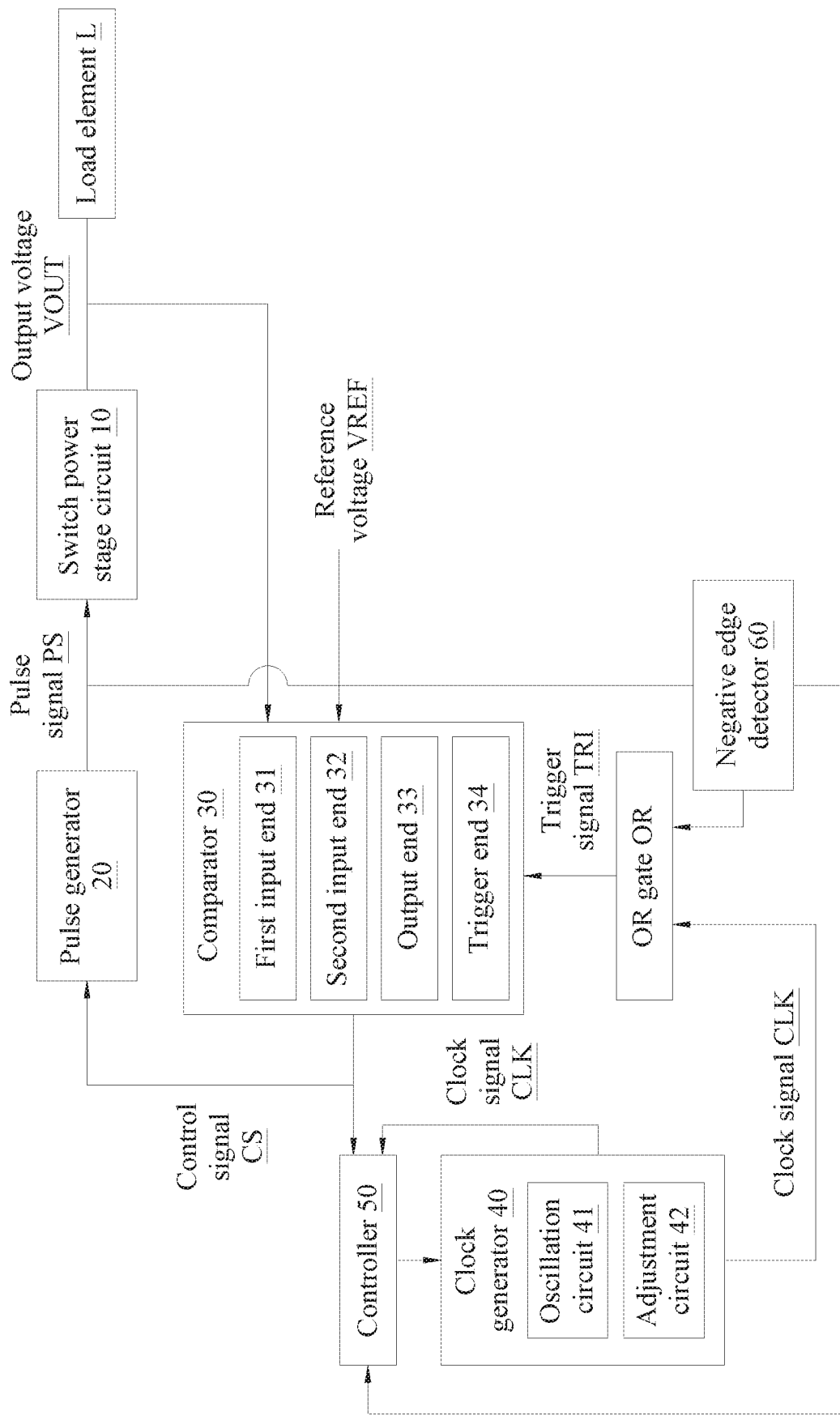
FIG. 4 is a block diagram of the second embodiment of the voltage regulation system according to the present disclosure.
Figure 5:
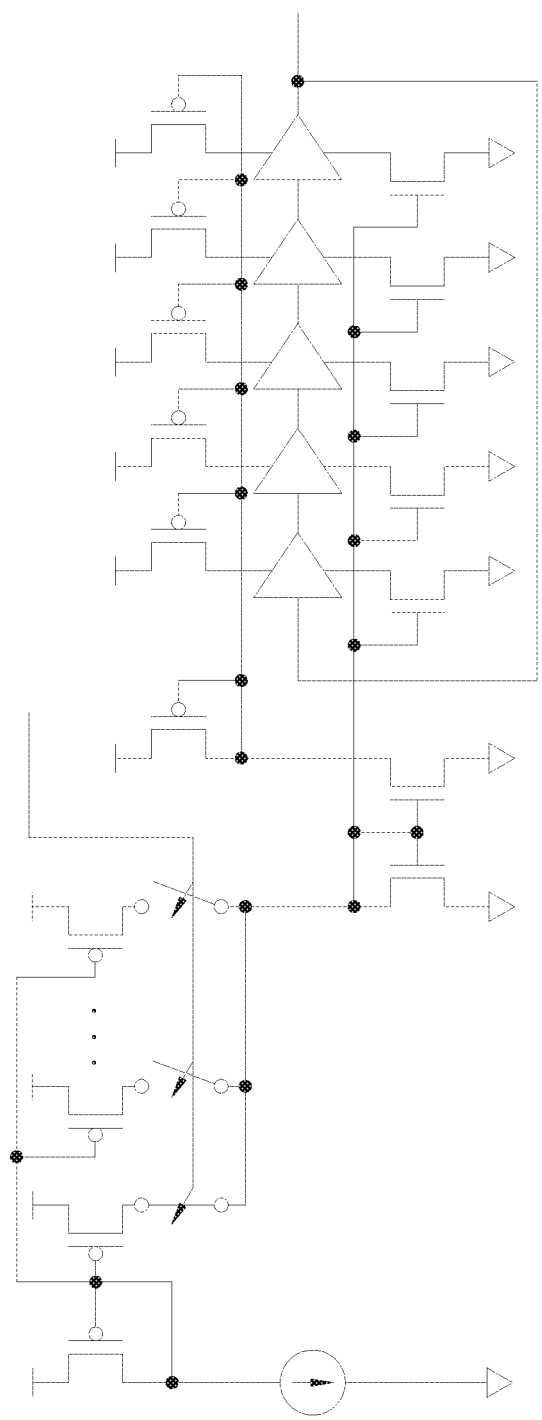
FIG. 5 is a configuration diagram of an oscillation circuit of the second embodiment of the voltage regulation system according to the present disclosure.

Please refer to FIG. 4 and FIG. 5 which are a block diagram of the second embodiment of the voltage regulation system according to the present disclosure and a configuration diagram of an oscillation circuit of the second embodiment of the voltage regulation system according to the present disclosure. In the embodiment, the configuration of the elements with the same numerals is similar to that described above, so the similar descriptions are not to be described herein.

As shown in FIG. 4 and FIG. 5, in the second embodiment of the present disclosure compared to the first embodiment, the clock generator 40 includes an oscillation circuit 41 and an adjustment circuit 42, the oscillation circuit 41 sends a clock signal CLK to the OR gate OR, and the adjustment circuit 42 receives the adjustment signal AS of the controller 50 to adjust the frequency of the clock signal CLK sent by the oscillation circuit 41. The oscillation circuit 41 may be a digitally controlled oscillator as shown in FIG. 5, which is formed of a current source circuit and a cascade amplifying circuit. The oscillation circuit 41 may also be, for example, a voltage-controlled oscillator, and the oscillation circuit 41 may be other types of oscillators according to actual requirements without being limited in the scope exemplified by the present disclosure.

Figure 6:
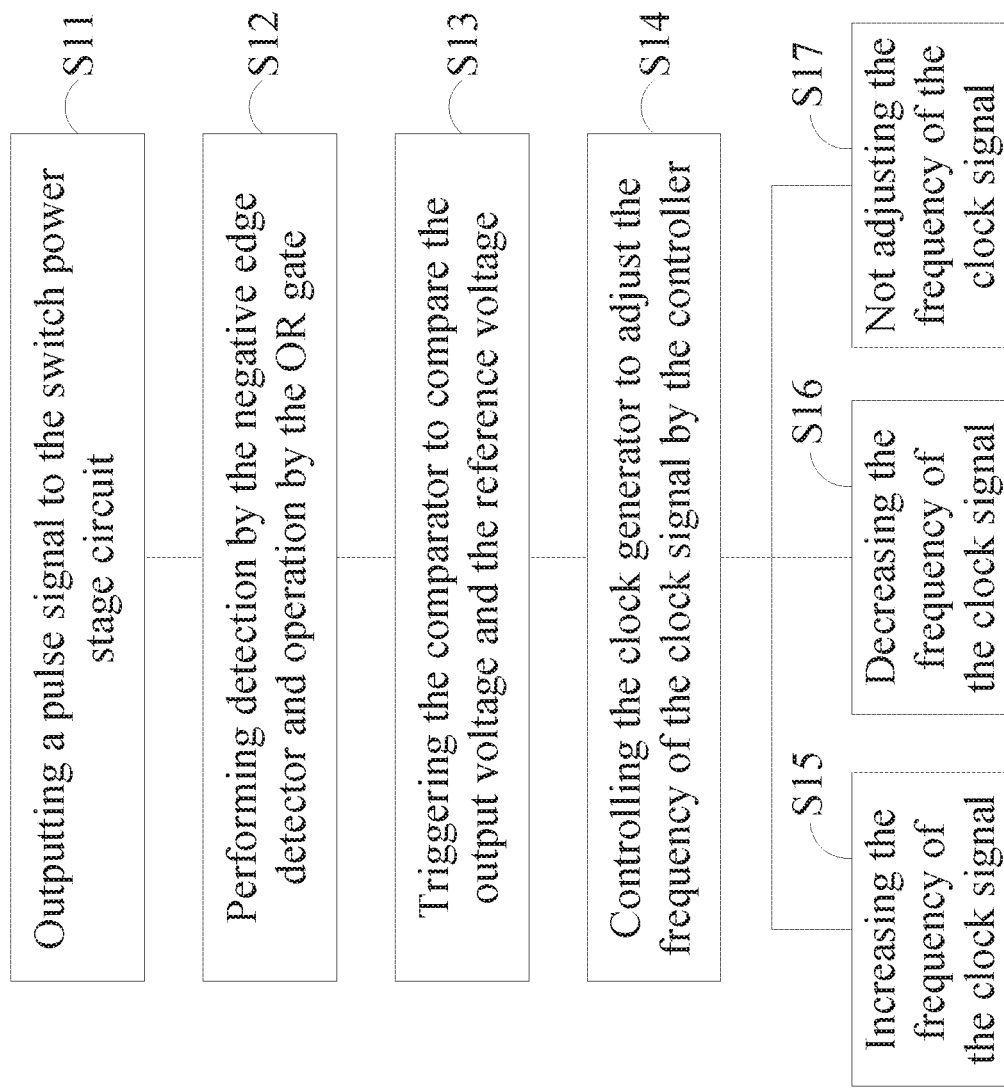
FIG. 6 is a flowchart of the voltage regulation method according to the present disclosure.

FIG. 6 is a flowchart of the voltage regulation method according to the present disclosure. As shown in FIG. 6, the voltage regulation method of the present disclosure is described with reference to FIG. 1 as follows.

Step S11: Outputting a pulse signal PS to a switch power stage circuit 10 to trigger the switch power stage circuit 10 to supply power to a load element L, wherein a voltage on the output end of the switch power stage circuit is defined as an output voltage, and the first input end 31 and the second input end 32 of the comparator 30 respectively receive the output voltage VOUT and the reference voltage VREF.

Step S12: Detecting the negative edge of the pulse signal PS by the negative edge detector 60, wherein the OR gate OR outputs the trigger signal TRI to the trigger end 34 of the comparator 30 based on the clock signal CLK generated by the clock generator 40 and the negative edge of the pulse signal PS.

Step S13: Receiving the trigger signal TRI from the trigger end 34 to trigger the comparator 30 to compare the output voltage VOUT and the reference voltage VREF to output the control signal CS to the controller 50.

Step S14: Outputting the adjustment signal AS based on the clock signal CLK, the control signal CS, and the negative edge of the pulse signal PS by the controller 50. Specifically, in a condition that the comparator 30 outputs the control signal CS when the positive edge of the clock signal CLK appears and the comparator outputs the control signal CS when the negative edge of the pulse signal PS appears, the controller 50 may determine the time point of the negative edge of the pulse signal PS after powering via the switch power stage circuit 10 (The output voltage VOUT is smaller than the reference voltage VREF), which indicates that the frequency of the clock signal CLK does not require adjustment. Proceed to step S17. In a condition that the comparator 30 outputs the control signal CS when the positive edge of the clock signal CLK appears and the comparator 30 also outputs the control signal CS when the negative edge of the pulse signal PS appears, the controller 50 may determine the time point of the negative edge of the pulse signal PS after powering via the switch power stage circuit 10 (The output voltage VOUT is smaller than the reference voltage VREF), which indicates that the frequency of the clock signal CLK needs to be increased. Proceed to step S15. In a condition that the comparator does not output the control signal CS when the positive edge of the clock signal CLK appears, the controller 50 may determine the time point of the negative edge of the pulse signal PS after powering via the switch power stage circuit 10 (The output voltage VOUT is smaller than the reference voltage VREF), which indicates that the frequency of the clock signal CLK needs to be decreased. Proceed to step S16.

Step S15: Outputting an adjustment signal AS which represents the increased frequency of the clock signal CLK to the clock generator 40 using the controller 50, and the clock generator 40 increases the frequency of the clock signal CLK based on the adjustment signal AS. The OR gate OR increases the frequency of the trigger signal TRI based on the increased frequency of the clock signal CLK and the negative edge of the pulse signal PS. The comparator 30 is, therefore, often triggered to increase the frequency of the control signal CS. The frequency of the pulse signal PS sent by the pulse generator 20 increases and the switching rate of the switch SW of the switch power stage circuit 10 is accelerated accordingly.

Step S16: Outputting an adjustment signal AS which represents the decreased frequency of the clock signal CLK to the clock generator 40 using the controller 50, and the clock generator 40 decreases the frequency of the clock signal CLK based on the adjustment signal AS. The OR gate OR decreases the frequency of the trigger signal TRI based on the decreased frequency of the clock signal CLK and the negative edge of the pulse signal PS. The comparator 30 is, therefore, less triggered to decrease the frequency of the control signal CS. The frequency of the pulse signal PS sent by the pulse generator 20 decreases and the switching rate of the switch SW of the switch power stage circuit 10 is decelerated accordingly.

Step S17: Outputting an adjustment signal AS which represents no adjustment to the frequency of the clock signal CLK to the clock generator 40 using the controller 50, and the clock generator 40 does not adjust the frequency of the clock signal CLK based on the adjustment signal AS. The OR gate OR does not adjust the frequency of the trigger signal TRI based on the frequency of the unadjusted clock signal CLK and the negative edge of the pulse signal PS. The comparator 30 still maintains the original frequency of the trigger signal TRI to send the control signal CS to the pulse generator 20, and the pulse generator 20 still maintains the original frequency to send the pulse signal PS to the switch SW of the switch power stage circuit 10.

Accordingly, through the comparator 30 and the controller 50, the voltage regulation system and method thereof of the present disclosure adjusts the frequency of the clock signal CLK and controls the pulse generator 20 to output a pulse signal PS to the switch power stage circuit 10, to enable the switch power stage circuit 10 to adjust an output voltage VOUT and output the adjusted output voltage to the load element L according to the situation of the load element L, thus decreasing the power loss of the switch power stage circuit 10.

The above description is merely illustrative rather than restrictive. Any equivalent modifications or alterations without departing from the spirit and scope of the present disclosure are intended to be included in the following claims.

What is claimed is:

1. A voltage regulation system comprising:
a switch power stage circuit having an output end electrically connected to a load element, wherein a voltage on the output end of the switch power stage circuit is defined as an output voltage;
a pulse generator connected to the switch power stage circuit and configured to output a pulse signal to the switch power stage circuit to trigger the switch power stage circuit to supply power to the load element;
a comparator having a first input end, a second input end, an output end, and a trigger end, the first input end receiving the output voltage, the second input end receiving a reference voltage, and the output end connected to the pulse generator, wherein when the comparator is triggered through the trigger end, the comparator performs a comparison based on the output voltage and the reference voltage, and when the comparator determines that the output voltage is lower than the reference voltage, the comparator outputs a control signal to trigger the pulse generator to output the pulse signal; and a clock generator configured to generate a clock signal, wherein the comparator triggers the comparison based on the clock signal and the pulse signal;

wherein a frequency of the clock signal is dynamically adjusted based on the pulse signal and the control signal;

wherein the comparator triggers the comparison respectively on a positive edge of the clock signal and a negative edge of the pulse signal, and in a condition that the comparator outputs the control signal when the positive edge of the clock signal appears and the comparator does not output the control signal when the negative edge of the pulse signal appears, the frequency of the clock signal stays the same.

2. The voltage regulation system according to claim 1, wherein in a condition that the comparator outputs the control signal when the positive edge of the clock signal appears and the comparator also outputs the control signal when the negative edge of the pulse signal appears, the frequency of the clock signal is increased.

3. The voltage regulation system according to claim 1, wherein in a condition that the comparator does not output the control signal when the positive edge of the clock signal appears, the frequency of the clock signal is decreased.

4. The voltage regulation system according to claim 1, further comprising a negative edge detector for detecting the negative edge of the pulse signal.

5. The voltage regulation system according to claim 4, further comprising an OR gate connected to the negative edge detector, the clock generator, and the trigger end of the comparator, wherein the OR gate generates the trigger signal to the trigger end of the comparator based on a detection result of the negative edge detector and the positive edge of the clock signal.

6. The voltage regulation system according to claim 1, wherein the comparator is a latch-type comparator.

7. A voltage regulation method comprising:

outputting a pulse signal to trigger a switch power stage circuit to supply power to a load element, wherein a voltage on the output end of the switch power stage circuit is defined as an output voltage;

performing a comparison based on the output voltage and a reference voltage by using a comparator, wherein when the comparator determines that the output voltage is lower than the reference voltage, the comparator outputs a control signal to trigger the pulse generator to output the pulse signal;

inputting a clock signal to the comparator to trigger the comparator to perform the comparison based on the clock signal and the pulse signal; and dynamically adjusting a frequency of the clock signal based on the pulse signal and the control signal;

wherein the comparator triggers the comparison respectively on a positive edge of the clock signal and a negative edge of the pulse signal, and in a condition that the comparator outputs the control signal when the positive edge of the clock signal appears and the comparator does not output the control signal when the negative edge of the pulse signal appears, the frequency of the clock signal stays the same.

8. The voltage regulation method according to claim 7, wherein in a condition that the comparator outputs the control signal when the positive edge of the clock signal appears and the comparator also outputs the control signal when the negative edge of the pulse signal, the frequency of the clock signal is increased.

9. The voltage regulation method according to claim 7, wherein in a condition that the comparator does not output the control signal when the positive edge of the clock signal appears, the frequency of the clock signal is decreased.

10. The voltage regulation method according to claim 7, further comprising detecting the negative edge of the pulse signal by a negative edge detector.

11. The voltage regulation method according to claim 10, further comprising connecting an OR gate to the negative edge detector, the clock generator, and the trigger end of the comparator, wherein the OR gate generates a trigger signal to the trigger end of the comparator by the OR gate based on a detection result of the negative edge detector and the positive edge of the clock signal.

12. A voltage regulation system, comprising:

a switch power stage circuit having an output end electrically connected to a load element, wherein a voltage on the output end of the switch power stage circuit is defined as an output voltage;

a pulse generator connected to the switch power stage circuit and configured to output a pulse signal to the switch power stage circuit to trigger the switch power stage circuit to supply power to the load element;

a clock generator configured to generate a clock signal;

a comparator configured to perform a first comparison based on the output voltage and the reference voltage based on a clock signal, and when the comparator determines that the output voltage is lower than the reference voltage, the comparator outputs a control signal to trigger the pulse generator to output the pulse signal, and wherein the comparator performs a second comparison based on the output voltage and the reference voltage in response to a negative edge of the pulse signal; and wherein a frequency of the clock signal is adjusted based on a result of the second comparison;

wherein the comparator triggers the comparison respectively on a positive edge of the clock signal and a negative edge of the pulse signal, and in a condition that the comparator outputs the control signal when the positive edge of the clock signal appears and the comparator does not output the control signal when the negative edge of the pulse signal appears, the frequency of the clock signal stays the same.

* * * * *